United States Patent [19]

Sato et al.

[11] Patent Number: 5,302,077
[45] Date of Patent: Apr. 12, 1994

[54] MAGAZINE CONVEYING APPARATUS

[75] Inventors: Koji Sato; Junichi Ide, both of Tokyo, Japan

[73] Assignee: Kabushiki Kaisha Shinkawa, Tokyo, Japan

[21] Appl. No.: 21,165

[22] Filed: Feb. 22, 1993

[30] Foreign Application Priority Data

Feb. 20, 1992 [JP] Japan ................... 4-069343

[51] Int. Cl.⁵ ............................................. B65G 1/04
[52] U.S. Cl. .................... 414/609; 198/468.6; 414/331
[58] Field of Search ............ 414/609, 331, 416; 198/468.6

[56] References Cited

U.S. PATENT DOCUMENTS

| | | | |
|---|---|---|---|
| 3,288,057 | 11/1966 | Loewenfeld | 414/331 X |
| 4,720,463 | 1/1988 | Farber et al. | 414/609 X |
| 4,804,307 | 2/1989 | Moteda | 414/609 X |
| 5,203,661 | 4/1993 | Tanita et al. | 414/331 |
| 5,222,856 | 6/1993 | Yamamoto et al. | 414/609 X |

FOREIGN PATENT DOCUMENTS 188329  7/1990  Japan ................... 414/331

Primary Examiner—David A. Bucci
Attorney, Agent, or Firm—Koda and Androlia

[57] ABSTRACT

An apparatus for conveying magazines which are for electronic devices such as semiconductors, etc. including a magazine pusher that pushes the magazines placed on a magazine stand toward an elevator, slide rails that are movable back and forth between the magazine stand and the elevator, and a slide rail pusher that drives the slide rails. When all the magazines on the magazine stand are pushed by the magazine pusher and the front most magazine among them is transferred onto the slide rails, slide rail pusher brings the slide rails to the elevator so that the elevator lifts the magazine to a predetermined height so that electronic devices are brought into or out of the magazine. Thus, many magazines are placed on the magazine stand without inviting any positioning errors, and the apparatus can meet any change of the size of the magazines to be conveyed.

4 Claims, 5 Drawing Sheets

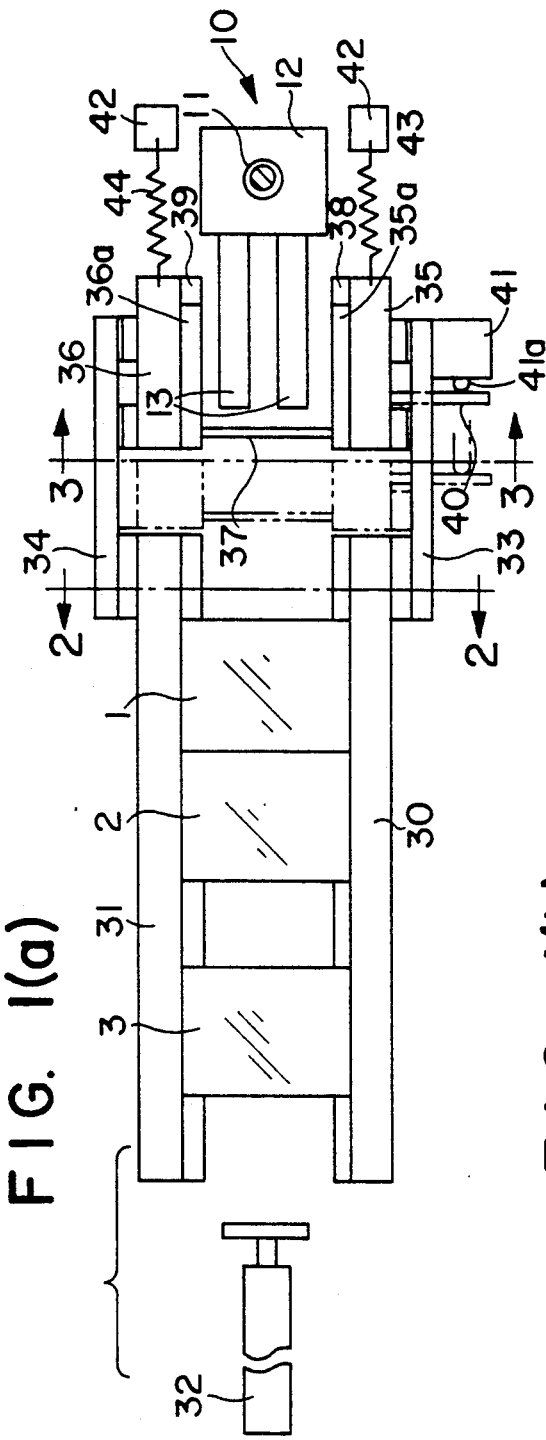
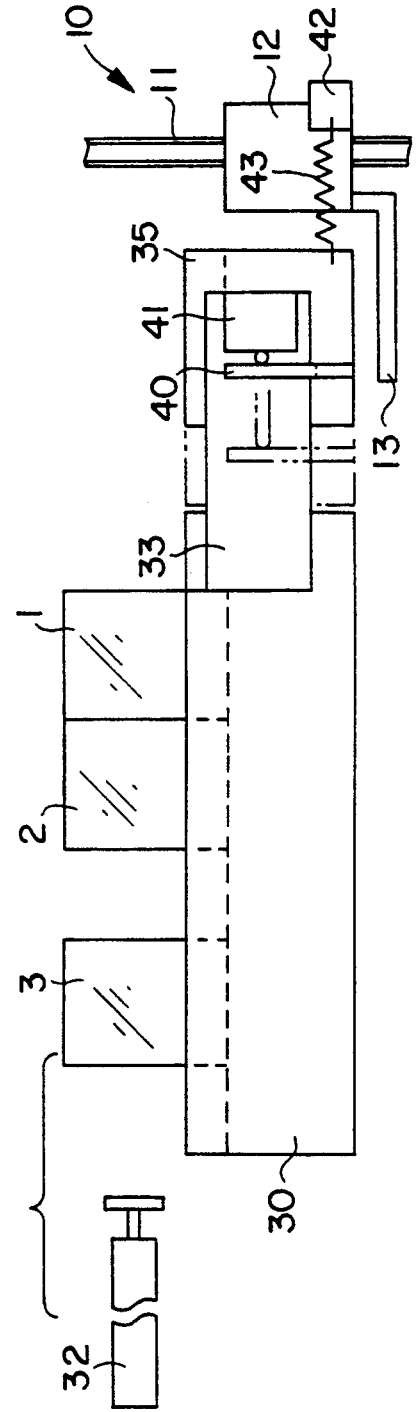
FIG. 1(a)
FIG. 1(b)

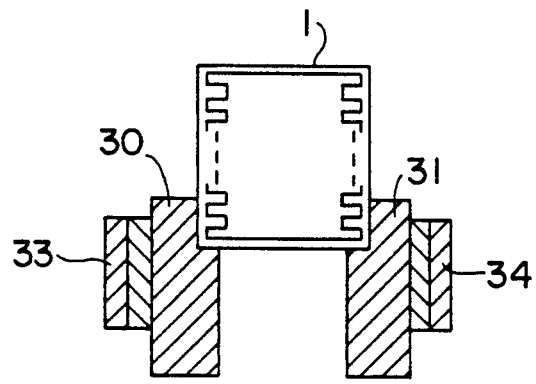
F I G. 2
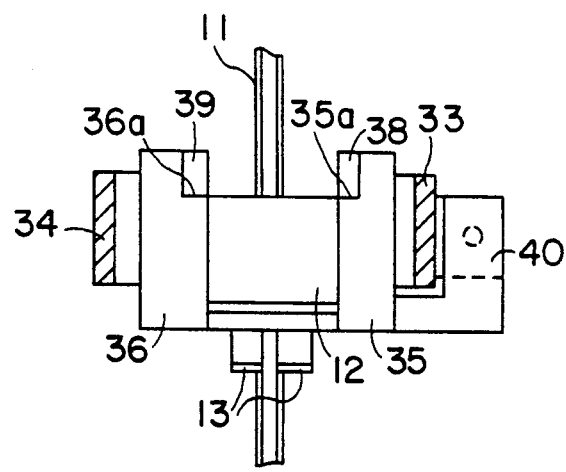
F I G. 3

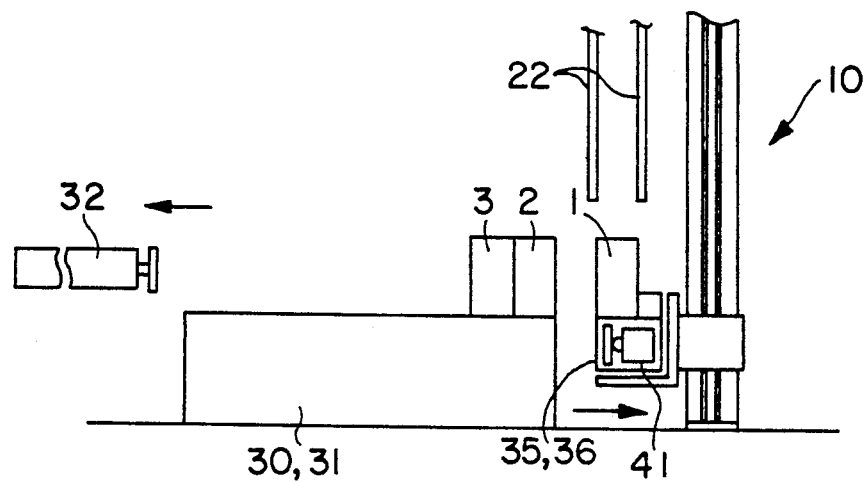
F I G. 5(a)
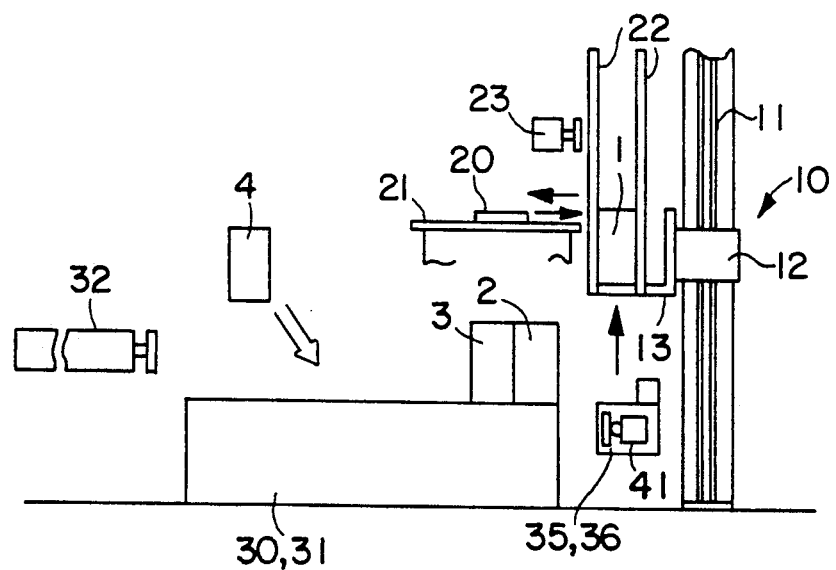
F I G. 5(b)

MAGAZINE CONVEYING APPARATUS

BACKGROUND OF THE INVENTION

1. Field of the Invention

The present invention relates to a magazine conveying apparatus that transfers one magazine at a time from a magazine stand to a magazine receiver of an elevator means.

2. Prior Art

FIG. 6a-f shows one of the conventional devices for conveying magazines that stores electronic devices such as semiconductors, etc. in the vertically arranged accommodation sections provided therein.

As shown in FIG. 6(a), the elevator 10 of the conveying device has a slider 12 that is engaged with a screw 11. When the screw 11 is rotated, the slider 12 is moved up and down. The slider 12 has a magazine receiver 13.

A magazine stand 14 that carries magazines 1 and 2 thereon is installed in front of the elevator 10, i.e., on the left side of the elevator 10 in the drawing. The magazine stand has an open space in the middle, and two sets of magazine receivers 15 and 16 are installed in the open space of the magazine stand 14. The magazine receivers 15 and 16 are installed on a U-shaped arm 17 which is moved up and down and also moved to the right and left by a driving means (not shown).

As shown in FIG. 6(f), the conveying device further includes a conveyor 21 installed above the magazine stand 14 to convey a workpiece 20. Magazine guide rails 22 for stabilizing the magazines, that are lifted by the magazine receiver 13, are installed above the magazine receiver 13. In addition, a clamper 23 is installed on the magazine guide rails 22. The clamper 23 holds the magazines which are filled with workpiece 20 or from which the workpieces 20 have been fed out.

In operation, as shown in FIG. 6(a), two magazines 1 and 2 are placed at two predetermined positions on the magazine stand 14. Then, as shown in FIG. 6(b), the arm 17 is raised to lift the magazines 1 and 2, and as shown in FIG. 6(c), the arm 17 is moved to the right (in the drawing) so that the first magazine 1 is positioned above the magazine receiver 13. Next, as shown in FIG. 6(d), the arm 17 is lowered, letting the magazine 1 be on the magazine receiver 13, and as shown in FIG. 6(e), the arm 17 moves to the left and returns to a waiting position. After this, as shown in FIG. 6(f), the screw 11 is rotated to raise the magazine receiver 13 until the uppermost accommodating section of the magazine 1 is positioned at the level of the conveying surface of the conveyor 21. The workpiece 20 on the conveyor 21 is brought into the magazine 1 or a workpiece inside the uppermost accommodating section of the magazine 1 is fed out onto the conveyor 21.

Each time the workpiece 20 is brought into the magazine or fed out from the magazine, the magazine is raised by one pitch so that the next accommodation section of the magazine comes to the height level of the conveyor 21. If the magazine is filled with the workpieces 20, or if all the workpieces 20 have been fed out from the magazine 1, then the magazine receiver 13 is raised, and the magazine 1 is temporarily held by the clamper 23 (until the next magazine is sent to the conveyor 21). Afterward, the magazine receiver 13 is lowered in order to receive the next magazine 2, and a new magazine 3 is placed on the magazine stand 14 for the next transfer operation.

In this prior art device, the arm 17 transfers the magazines to the magazine receiver 13 of the elevator 10 by repeating the vertical and horizontal movements. Accordingly, only a small number of magazines are placed on the magazine stand 14. In addition, the positions where the magazines 1 and 2 are placed are limited (only two), and positioning errors are easily made by the operator. Moreover, if the size of the magazines changes, the magazine receivers 15 and 16 must be changed accordingly (in the space distance, etc.).

SUMMARY OF THE INVENTION

In view of the above, the object of the present invention is to provide a magazine conveying apparatus that allows a large number of magazines to be placed on the magazine stand, can avoid positioning errors, and requires no adjustment in the mechanism that transfers the magazines from the magazine stand to the elevator even when the size of the magazine is changed.

The object of the present invention is accomplished by a unique structure for a magazine conveying apparatus which transfers one magazine at a time from a magazine stand to a magazine receiver of an elevator, and the conveying apparatus of the present invention includes a magazine pusher that pushes the magazine(s) on the magazine stand toward an elevator, slide rails which are installed on the elevator side of the magazine stand and moves horizontally between the elevator and the magazine stand, and a slide rail pusher that has a power greater than the power of the magazine pusher and drives the slide rails back and forth.

With the structure described above, one magazine on the magazine stand is pushed (or transferred) onto the slide rails when the slide rail pusher and the magazine pusher are actuated in the opposite directions while the magazine receiver of the elevator is positioned beneath the magazine carrying surfaces of the slide rails, and then the magazine receiver of the elevator is raised after the magazine which has been transferred onto the slide rails is positioned directly above the magazine receiver.

More specifically, with the magazine receiver of the elevator moved to a position lower than the magazine carrying surfaces of the slide rails, the slide rail pusher is actuated so that the slide rails are moved toward the magazine stand. Then, the magazine pusher is actuated so that all the magazines on the magazine stand are pushed until the leading (or the front most) magazine on the magazine stand is pushed onto the slide rails. Next, after the magazine pusher has been retracted, the slide rail pusher is retracted so that the magazine on the slide rails is brought above the magazine receiver of the elevator. When the magazine receiver of the elevator is raised, the magazine receiver receives the magazine from the slide rails and lifts it to a predetermined height.

BRIEF DESCRIPTION OF THE DRAWINGS

FIG. 1(a) is a top view showing one embodiment of the magazine conveying apparatus of the present invention, and FIG. 1(b) is a front view thereof;

FIG. 2 is a cross section taken along the line 2—2 in FIG. 1(a);

FIG. 3 is a cross section taken along the line 3—3 in FIG. 1(a);

FIGS. 5(a) and 5(b) illustrate the operation steps of the magazine conveying apparatus of the present invention after the step shown in FIG. 4(c)

DETAILED DESCRIPTION OF THE INVENTION

Figure 4A:
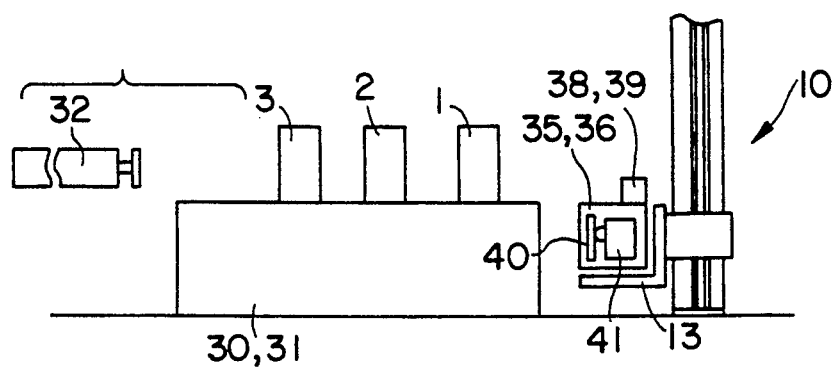
FIGS. 4(a) through 4(c) illustrate the operation steps of the magazine conveying apparatus of the present invention.

One embodiment of the present invention will be described with reference to FIGS. 1a through 5b. Components which are the same as those of the device shown in FIG. 6 are given the same numbers, and the description of such components is omitted.

As shown in FIGS. 1a through 3, magazine stands 30 and 31 that consist of two or a pair of parallel guide rails are positioned in front of an elevator 10, that is, the magazine stands are on the left side of the elevator 10 in FIG. 1a.

A magazine pusher 32, which is, for example, an air cylinder, is installed on the opposite side of the magazine stands 30 and 31 from the elevator 10.

Guide rails 33 and 34 are mounted on the sides of the magazine stands 30 and 31 near the elevator 10, and slide rails 35 and 36 are installed on these guide rails 33 and 34 so that the slide rails 35 and 36 are slidable on the guide rails 33 and 34. The bottoms of the slide rails 35 and 36 are connected by a connecting plate 37. Thus, the slide rails are in an integral unit and move together. The slide rails 35 and 36 have stoppers 38 and 39, respectively, on the magazine carrying surfaces 35a and 36a. An L-shaped actuating plate 40 (see FIG. 3) is attached to the slide rail 35, and a slide rail pusher 41 which is, for instance, an air cylinder, is mounted at the end of the slide rail 35 to face the actuating plate 40.

The slide rails 35 and 36 are urged by springs 43 and 44 so that the actuating plate 40 is in contact with the actuating rod 41a of the slide rail pusher 41. Each one of the springs 43 and 44 is connected at one end to a fixed part 42 of the conveying apparatus and at other end to the slide rails 35 and 36. The power of the slide rail pusher 41 is set greater than the sum of the power of the magazine pusher 32 and the spring force of the springs 43 and 44.

Next, the operation of the embodiment will be described with reference to FIGS. 4a-c and 5a.

Magazines 1, 2 and 3 (only three are shown in the drawings as an example) are set on the magazine stands 30 and 31 as shown in FIG. 4(a). Each magazine has several accommodation sections that are arranged vertically. As many magazines as the magazine stands 30 and 31 can hold are set on the magazine stands 30 and 31.

Figure 4B:
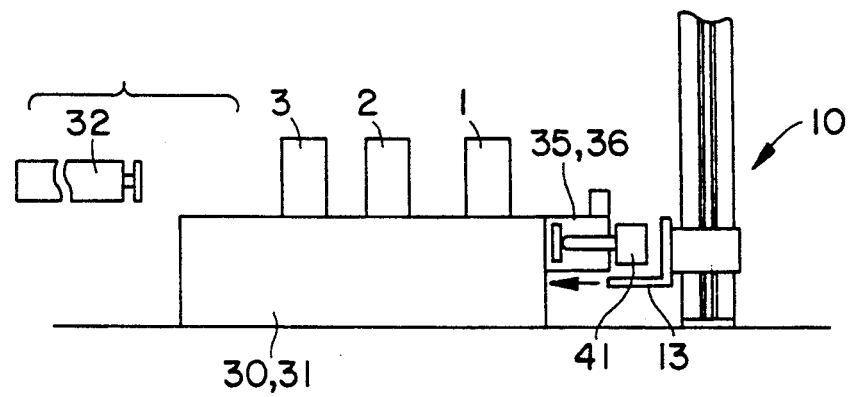

When the slide rail pusher 41 is actuated, the slide rails 35 and 36 advance as shown by the arrow in FIG. 4(b) as guided by the guide rails 33 and 34 until the slide rails 35 and 36 come into contact with the magazine stands 30 and 31. Then, the magazine pusher 32 is actuated as shown by the arrow in FIG. 4(c), and the magazines 1, 2 and 3 are pushed to the right (in the drawing) so that the first magazine 1 (or the front most magazine in the pushing direction) is pushed onto the slide rails 35 and 36 and comes into contact with the stoppers 38 and 39.

Figure 4C:
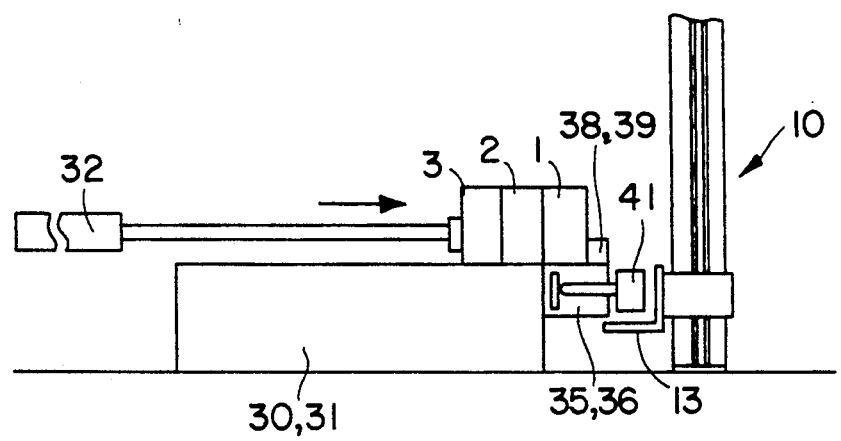
Figure 6A:
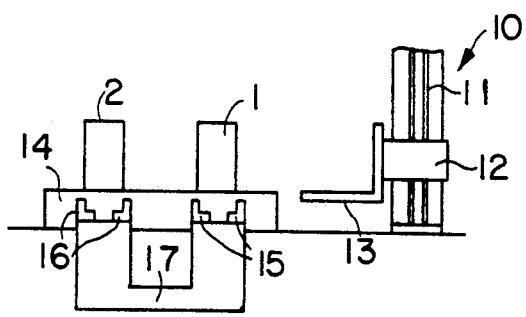
FIGS. 6(a) through 6(f) illustrate the operation steps of a conventional magazine conveying device.
Figure 6D:
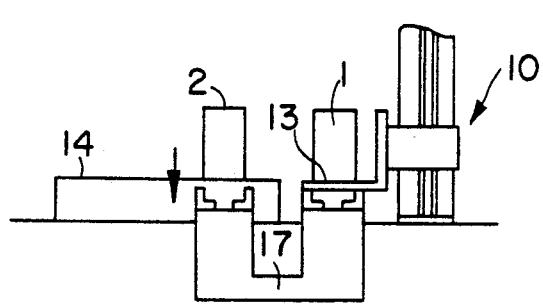
Figure 6B:
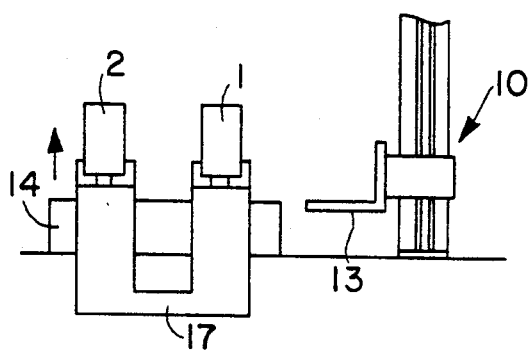
Figure 6E:
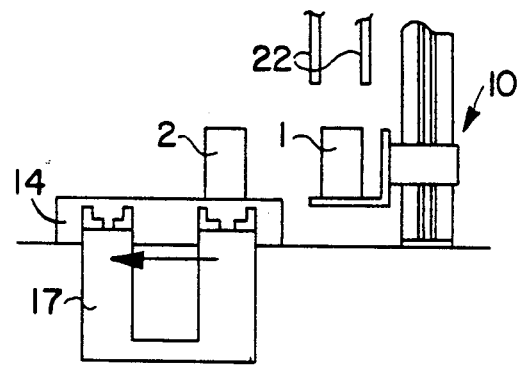
Figure 6C:
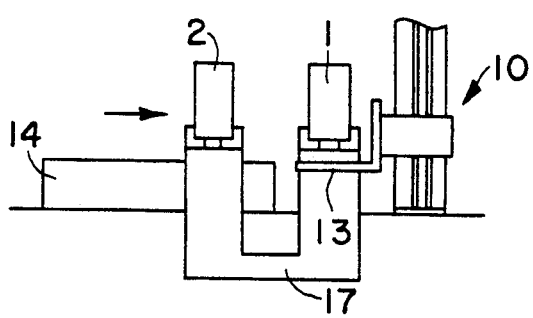
Figure 6F:
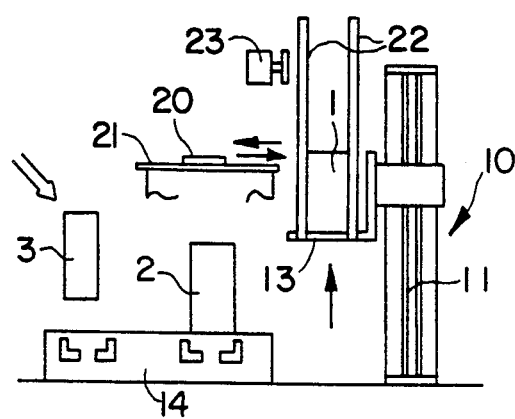

As described above, since the power of the slide rail pusher 41 is greater than the sum of the power of the magazine pusher 32 and the driving force of the springs 43 and 44, the stroke of the magazine pusher 32 to push the magazines is limited by the position of the stoppers 38 and 39. In other words, the magazine pusher 32 cannot push the slide rails 35 and 36 after the magazine has come into contact with the stoppers 38 and 39. Accordingly, all the magazines 1, 2 and 3 are pushed toward the elevator 10 regardless of the number magazines, the length of each magazine or the size of the spaces between the magazines as shown in FIG. 4(c).

Next, as shown in FIG. 5(a), the magazine pusher 32 is actuated in the opposite direction from that described above to retract, and the slide rail pusher 41 is also actuated in the opposite direction from that described above to retract. As a result, the next magazine 2 is stopped at the front ends of the magazine stands, and the first magazine 1 on the slide rails 35 and 36 is moved to the right in FIG. 5(a) as the slide rails 35 and 36 are moved along the guide rails 33 and 34 until the magazine 1 is positioned directly above the magazine receiver 13.

Subsequently, as in the conventional device, the screw 11 is rotated so that the magazine receiver 13 is raised until the uppermost accommodation section of the magazine 1 is lifted to the height level of the conveying surface of the conveyor 21. Then, the workpiece 20 on the conveyor 21 is brought into the magazine 1, or the workpiece 20 in the magazine 1 is fed out onto the conveyor 21. Each time the workpiece 20 is brought into or fed out of the magazine 1, the magazine 1 is raised by one pitch for the next accommodation section.

When the magazine 1 is filled with the workpieces 20 (or a certain number of workpieces are brought into the magazine 1), or when all (or a certain number) of the workpieces 20 inside the magazine 1 have been fed out, the magazine receiver 13 is further raised, and the magazine 1 is temporarily held by the clamper 23 (until the next magazine 2 is sent to the conveying surface level of the conveyor 21), and then the magazine 1 is manually removed from the conveying apparatus. Afterward, the magazine receiver 13 is lowered in order to receive the next magazine 2. If necessary, additional magazine(s) 4 is placed on the magazine stands 30 and 31.

As seen from the above, in the apparatus of the present invention, all the magazines on the magazine stands 30 and 31 are pushed and only one magazine (that is at the front most) is transferred onto the slide rails 35 and 36, and then the slide rails 35 and 36 are moved back to above the magazine receiver 13 of the elevator 10. The magazine receiver 13 is then raised so that the magazine is lifted by the magazine receiver 13 from the slide rails 35 and 36. Accordingly, it is possible to put the magazines at any desired points on the magazine stands 30 and 31 as long as they are within the limits determined by the surface of the magazine stands 30 and 31. In addition, positioning errors by the operator are eliminated, and there is no need for making an adjustment of the mechanism that transfers the magazines from the magazine stands to the magazine receiver of the elevator.

According to the present invention, the magazine conveying apparatus can allow a large number of magazines to be placed on the magazine stands, it can prevent positioning errors, and it needs no adjustment of the magazine transfer mechanisms even when the size of the magazine changes.

We claim:

1. A magazine conveying apparatus, which transfers one magazine at a time from a magazine stand to a magazine receiver of an elevator means for lifting said magazine comprising sing a magazine pusher that pushes said magazines on said magazine stand toward said elevator means, slide rails that are installed so as to move horizontally toward said elevator means from said magazine stand, and a slide rail pusher that drives said slide rails back and forth and has a power greater than a power of said magazine pusher, wherein one magazine on said magazine stand is transferred onto said slide rails by actuating said slide rail pusher and said magazine pusher with the magazine receiver of said elevator means being positioned beneath magazine carrying surfaces of said slide rails, and said magazine receiver of said elevator means is raised when said magazine which has been transferred onto said slide rails is positioned directly above said magazine receiver.

2. A magazine conveying apparatus for transferring one magazine at a time from a magazine stand to a magazine receiver of an elevator means for lifting said magazine, said conveying apparatus comprising:
a magazine pusher that pushes said magazines on said magazine stand toward said elevator means;
slide rails that are movable back and forth between said magazine stand and said elevator means;
a slide rail pusher that moves said slide rails back and forth,
wherein when one of said magazines on said magazine stand is transferred onto said slide rails via said magazine pusher after said slide rail has come into contact with said magazine stand, said slide rail with said one magazine thereon is moved toward said elevator means via said slide rail pusher so that said magazine receiver of said elevator means is raised to lift said magazine to a predetermined position.

3. A magazine conveying apparatus according to claim 1, wherein said magazine stand comprises a pair of parallel guide rails.

4. A magazine conveying apparatus according to claim 2, wherein said magazine stand comprises a pair of parallel guide rails.

* * * * *